(12) United States Patent
Hasegawa

(10) Patent No.: US 12,360,629 B2
(45) Date of Patent: Jul. 15, 2025

(54) METHOD OF PRODUCING TOUCH SENSOR AND TOUCH SENSOR

(71) Applicant: FUJIFILM Corporation, Tokyo (JP)

(72) Inventor: Kazuhiro Hasegawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/671,600

(22) Filed: May 22, 2024

(65) Prior Publication Data

US 2025/0004588 A1  Jan. 2, 2025

(30) Foreign Application Priority Data

Jun. 28, 2023 (JP) ................................. 2023-105815

(51) Int. Cl.
*G06F 3/041* (2006.01)
*G06F 3/044* (2006.01)
*G03F 7/40* (2006.01)

(52) U.S. Cl.
CPC ........ *G06F 3/04164* (2019.05); *G06F 3/0445* (2019.05); *G06F 3/0446* (2019.05); *G03F 7/40* (2013.01); *G06F 2203/04103* (2013.01)

(58) Field of Classification Search
CPC ...... G06F 3/041–047; G06F 2203/041–04114; B32B 2457/208; H10K 59/40
See application file for complete search history.

(56) References Cited

FOREIGN PATENT DOCUMENTS

JP  2013-051391 A  3/2013

*Primary Examiner* — Sanjiv D. Patel
(74) *Attorney, Agent, or Firm* — Edwards Neils LLC; Jean C. Edwards, Esq.

(57) ABSTRACT

A touch sensor where disconnection of peripheral wirings is prevented and a method of producing the touch sensor. The method includes in order: preparing a substrate including a detection region and a peripheral region; forming a metal layer in the peripheral region; forming detection electrode connection terminals, external connection terminals, and peripheral wirings that connect the plurality of detection electrode connection terminals and the plurality of external connection terminals to each other by patterning a photosensitive resist on the metal layer through photolithography and subjecting the metal layer to wet etching; forming a to-be-plated layer in the detection region, which extends to cover at least a part of each of the detection electrode connection terminals, and includes a pattern composed of a plurality of thin wires; and forming touch detection electrodes that are electrically connected to the detection electrode connection terminals on the to-be-plated layer by a wet plating method.

12 Claims, 5 Drawing Sheets

METHOD OF PRODUCING TOUCH SENSOR AND TOUCH SENSOR

CROSS-REFERENCE TO RELATED APPLICATIONS

The present application claims priority under 35 U.S.C. § 119 to Japanese Patent Application No. 2023-105815, filed on Jun. 28, 2023. The above application is hereby expressly incorporated by reference, in its entirety, into the present application.

BACKGROUND OF THE INVENTION

1. Field of the Invention

The present invention relates to a method of producing a touch sensor that detects a touch operation and a touch sensor.

2. Description of the Related Art

In the related art, in various electronic apparatuses including portable information apparatuses such as a tablet-type computer and a smartphone, a touch sensor that detects a so-called touch operation of allowing a finger, a stylus pen, or the like to contact or approach a screen has been used. Such a touch sensor usually has touch detection electrodes that are formed on a detection region of a substrate and detect a touch operation, external connection terminals that are formed on a peripheral region of the substrate positioned at the periphery of the detection region and are used to electrically connect the touch sensor to an external apparatus, and peripheral wirings that are used to electrically connect the touch detection electrodes and the external connection terminals to each other and are formed on the peripheral region.

Here, in the general production of the touch sensor, the touch detection electrodes, the external connection terminals, and the peripheral wirings are often simultaneously formed on the substrate in order to facilitate the production. In this case, for example, a so-called plating method disclosed in JP2013-051391A may be used. In this case, a to-be-plated layer, having a pattern corresponding to the touch detection electrodes, the external connection terminals, and the peripheral wirings, is formed on the substrate, and then the substrate is immersed in a plating liquid to precipitate a metal on the to-be-plated layer, thus allowing the formation of the touch detection electrodes, the external connection terminals, and the peripheral wirings.

SUMMARY OF THE INVENTION

By the way, in recent years, it has been required to narrow a line width of a peripheral wiring and an inter-wiring distance between peripheral wirings adjacent to each other in order to narrow the peripheral region. However, in a case where peripheral wirings having a narrow line width and a narrow inter-wiring distance are formed on a substrate simultaneously with touch detection electrodes and external connection terminals using the plating method as disclosed in JP2013-051391A, bubbles generated during the plating treatment or impurities mixed for some reason are located on the to-be-plated layer corresponding to the peripheral wirings, and thus the peripheral wirings to be finally formed may be in a disconnected state.

The present invention has been made in order to solve the above problems, and an object thereof is to provide a method of producing a touch sensor where disconnection of peripheral wirings can be prevented and a touch sensor.

According to the following configuration, the above-described object can be achieved.

[1] A method of producing a touch sensor, the method comprising in order:
preparing a substrate including a detection region and a peripheral region disposed around the detection region;
forming a metal layer in the peripheral region of the substrate;
forming a plurality of detection electrode connection terminals, a plurality of external connection terminals, and a plurality of peripheral wirings that connect the plurality of detection electrode connection terminals and the plurality of external connection terminals to each other by patterning a photosensitive resist on a surface of the metal layer through photolithography and subjecting the metal layer to wet etching;
forming a to-be-plated layer that is formed in the detection region of the substrate, extends to cover at least a part of each of the plurality of detection electrode connection terminals, and includes a pattern composed of a plurality of thin wires; and
forming a plurality of touch detection electrodes that are electrically connected to the plurality of detection electrode connection terminals on the to-be-plated layer by a wet plating method.

[2] The method of producing a touch sensor according to [1], the method further comprising:
forming a first protective layer that covers at least the plurality of peripheral wirings between forming the plurality of detection electrode connection terminals, the plurality of external connection terminals, and the plurality of peripheral wirings and forming the to-be-plated layer.

[3] The method of producing a touch sensor according to [2], the method further comprising:
forming a second protective layer that covers the touch detection electrodes.

[4] The method of producing a touch sensor according to [3],
in which the first protective layer and the second protective layer have different compositions.

[5] The method of producing a touch sensor according to any one of [1] to [4],
in which the to-be-plated layer is formed through photolithography.

[6] A touch sensor comprising:
a substrate including a detection region and a peripheral region disposed around the detection region;
a plurality of detection electrode connection terminals disposed in the peripheral region of the substrate;
a plurality of external connection terminals disposed in the peripheral region of the substrate;
a plurality of peripheral wirings disposed in the peripheral region of the substrate and connecting the plurality of detection electrode connection terminals and the plurality of external connection terminals to each other;
a to-be-plated layer that is formed in the detection region of the substrate, extends to cover at least a part of each of the plurality of detection electrode connection terminals, and includes a pattern composed of a plurality of thin wires; and
a plurality of touch detection electrodes disposed on at least a part of each of the plurality of detection electrode connection terminals and the to-be-plated layer and electrically connected to the plurality of detection electrode connection terminals.

[7] The touch sensor according to [6], in which an inter-wiring distance between the plurality of peripheral wirings adjacent to each other is 15.00 μm or less.

[8] The touch sensor according to [6] or [7], in which the to-be-plated layer contains an organic substance as a main component and contains a palladium catalyst.

According to the present invention, a method of producing a touch sensor includes in order: preparing a substrate including a detection region and a peripheral region disposed around the detection region; forming a metal layer in the peripheral region of the substrate; forming a plurality of detection electrode connection terminals, a plurality of external connection terminals, and a plurality of peripheral wirings that connect the plurality of detection electrode connection terminals and the plurality of external connection terminals to each other by patterning a photosensitive resist on a surface of the metal layer through photolithography and subjecting the metal layer to wet etching; forming a to-be-plated layer that is formed in the detection region of the substrate, extends to cover at least a part of each of the plurality of detection electrode connection terminals, and includes a pattern composed of a plurality of thin wires; and forming a plurality of touch detection electrodes that are electrically connected to the plurality of detection electrode connection terminals on the to-be-plated layer by a wet plating method, and thus it is possible to prevent disconnection of the peripheral wirings.

DESCRIPTION OF THE PREFERRED EMBODIMENTS

Hereinafter, a conductive member for a touch panel and a touch panel according to the present invention will be described in detail, based on preferred embodiments shown in the accompanying drawings.

In the following description, a numerical range indicated by the expression "to" includes numerical values described on both sides. For example, in a case where "s is a numerical value t1 to a numerical value t2", the range of s includes the numerical value t1 and the numerical value t2, and denotes t1≤s≤t2 as expressed in mathematical symbols.

Unless otherwise specified, the meaning of an angle such as a term "perpendicular" or "parallel" includes a case where an error range is generally allowable in the technical field.

The term "transparent" indicates that a light transmittance in a visible wavelength range of 400 nm to 800 nm is at least 40% or more, preferably 75% or more, more preferably 80% or more, and still more preferably 90% or more. The light transmittance is measured using "Plastics—Determination of Total Luminous Transmittance and Reflectance" defined by JIS K 7375:2008.

EMBODIMENTS

Figure 1:
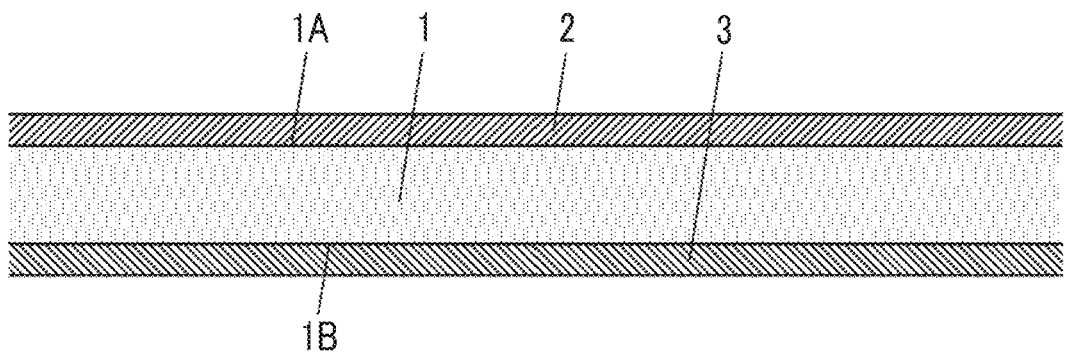
FIG. 1 is a partial cross-sectional view of a touch sensor according to an embodiment.

FIG. 1 shows a configuration of a touch sensor according to an embodiment of the present invention.

The touch sensor includes a substrate 1 having a first surface 1A and a second surface 1B, that form the front and back of the substrate, a first conductive layer 2 disposed on the first surface 1A of the substrate 1, and a second conductive layer 3 disposed on the second surface 1B of the substrate 1. The substrate 1 has insulating properties, and the first conductive layer 2 and the second conductive layer 3 are electrically insulated from each other. In addition, the substrate 1 has flexibility, and the touch sensor has flexibility conforming to the flexibility of the substrate 1. In addition, the substrate 1 is composed of a transparent material.

The touch sensor has a cover member (not shown) that is bonded to a surface on the first conductive layer 2 side, and a display module (not shown) that is bonded to a surface on the second conductive layer 3 side, and as a result, it can be used as a touch panel display device (not shown). In this case, a finger, a stylus pen, or the like of a user that contacts or approaches the cover member is detected, and a touch operation by the user is detected.

Figure 2:
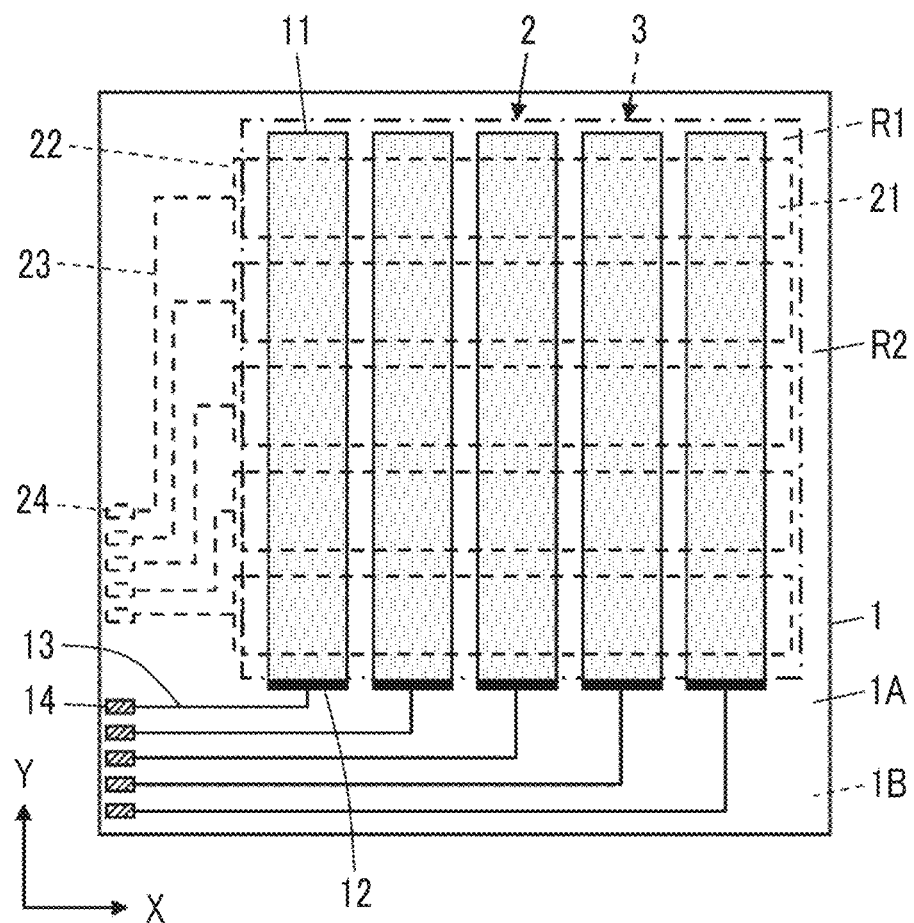
FIG. 2 is a plan view of the touch sensor according to the embodiment.

FIG. 2 is a plan view of the touch sensor. The substrate 1 has a detection region R1 and a peripheral region R2 disposed around the detection region R1.

The first conductive layer 2 includes: a plurality of touch detection electrodes 11 for detecting a touch operation that are formed in the detection region R1, extend in a given Y direction, and are arranged in an X direction perpendicular to the Y direction; a plurality of detection electrode connection terminals 12 that are formed in the peripheral region R2 and formed at one ends of the plurality of touch detection electrodes 11; a plurality of external connection terminals 14 that are formed in the peripheral region R2 and used for electrical connection to an external apparatus (not shown); and a plurality of peripheral wirings 13 that are formed in the peripheral region R2 and electrically connect the plurality of detection electrode connection terminals 12 and the plurality of external connection terminals 14 to each other. Although described below, the first conductive layer 2 in the detection region R1 has a to-be-plated layer that is covered with the plurality of touch detection electrodes 11.

The second conductive layer 3 includes: a plurality of touch detection electrodes 21 for detecting a touch operation that are formed in the detection region R1, extend in the X direction, and are arranged in the Y direction; a plurality of detection electrode connection terminals 22 that are formed in the peripheral region R2 and formed at one ends of the plurality of touch detection electrodes 21; a plurality of external connection terminals 24 that are formed in the peripheral region R2 and used for electrical connection to an external apparatus (not shown); and a plurality of peripheral wirings 23 that are formed in the peripheral region R2 and electrically connect the plurality of detection electrode connection terminals 22 and the plurality of external connection terminals 24 to each other. Although described below, the second conductive layer 3 in the detection region R1 has a to-be-plated layer that is covered with the plurality of touch detection electrodes 21.

Although described below in detail, the plurality of detection electrode connection terminals 12, the plurality of peripheral wirings 13, and the plurality of external connection terminals 14 can be formed by, for example, forming a metal layer on the first surface 1A of the substrate 1 in the peripheral region R2, patterning a photosensitive resist on the metal layer through so-called photolithography, and subjecting the metal layer to so-called wet etching. In addition, after the formation of the plurality of detection electrode connection terminals 12, the plurality of peripheral wirings 13, and the plurality of external connection terminals 14, the plurality of touch detection electrodes 11 can be formed by, for example, forming a to-be-plated layer on the first surface 1A of the substrate 1 in the detection region R1 and precipitating a metal on the to-be-plated layer using a so-called wet plating method.

On the second surface 1B side of the substrate 1, the plurality of touch detection electrodes 21, the plurality of detection electrode connection terminals 22, the plurality of peripheral wirings 23, and the plurality of external connection terminals 24 can also be formed in the same manner as the plurality of touch detection electrodes 11, the plurality of detection electrode connection terminals 12, the plurality of peripheral wirings 13, and the plurality of external connection terminals 14.

Figure 3:
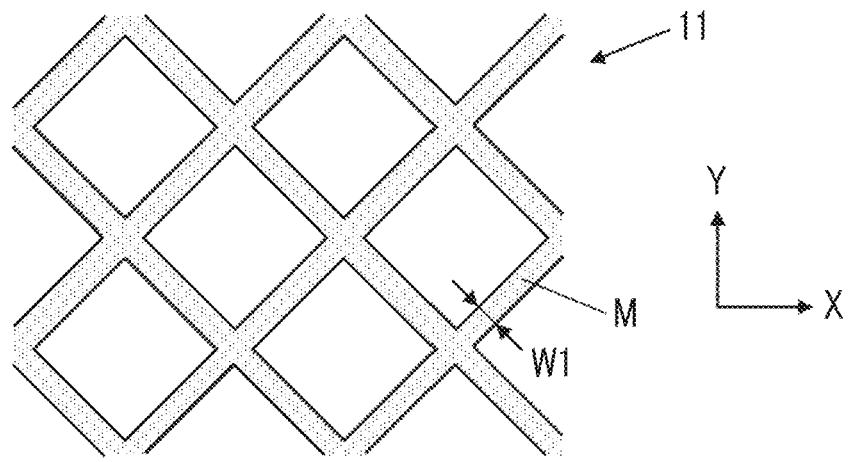
FIG. 3 is an enlarged plan view showing a part of a touch detection electrode according to the embodiment.

As shown in FIG. 3, the touch detection electrode 11 in the first conductive layer 2 is composed of a plurality of fine metal wires M forming a mesh shape. In order to suppress the occurrence of a so-called moire in a case where the touch detection electrode 11 disposed on a display module (not shown) is visually recognized by an observer, an average value of line widths W1 of the plurality of fine metal wires M is preferably 0.50 µm to 3.00 µm, and more preferably in a range of 1.00 µm to 2.00 µm.

Figure 4:
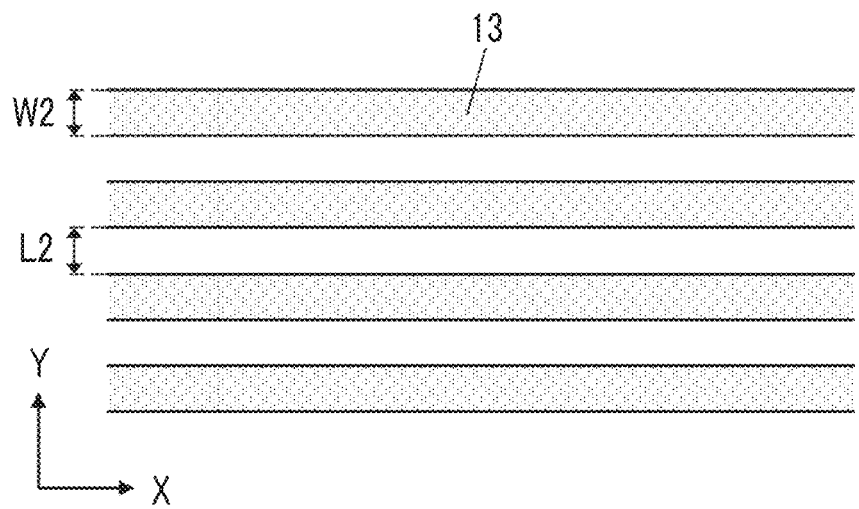
FIG. 4 is an enlarged plan view showing a part of a plurality of peripheral wirings according to the embodiment.

As shown in FIG. 4, the peripheral wiring 13 in the first conductive layer 2 has a line width W2. In addition, the plurality of peripheral wirings 13 are disposed at positions closest to each other with an inter-wiring distance L2 therebetween. In order to narrow the peripheral region R2 while ensuring the conductivity of the peripheral wirings 13, the line width W2 and the inter-wiring distance L2 of the peripheral wirings 13 are, for example, preferably 1.00 µm or more and 30.00 µm or less, and more preferably 5.00 µm or more and 15.00 µm or less.

Figure 5:
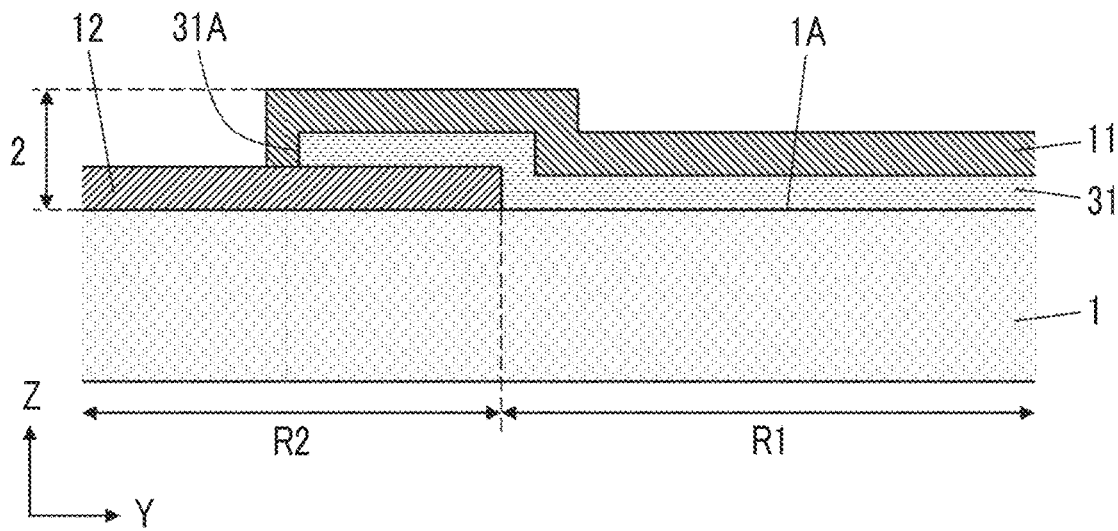
FIG. 5 is an enlarged cross-sectional view showing a part of a first conductive layer according to the embodiment.

FIG. 5 shows a cross-sectional view of the touch sensor showing a boundary portion between the detection region R1 and the peripheral region R2 of the substrate 1. The detection electrode connection terminal 12 of the first conductive layer 2 is formed on the first surface 1A of the substrate 1 in the peripheral region R2. A to-be-plated layer 31 is formed on the first surface 1A of the substrate 1 in the detection region R1. The to-be-plated layer 31 is a layer on which the metal constituting the plurality of touch detection electrodes 11 is precipitated by a wet plating method. The to-be-plated layer 31 contains a catalyst such as a palladium (Pd) catalyst that promotes the precipitation of the metal. The to-be-plated layer 31 extends toward the peripheral region R2 to cover at least a part of the detection electrode connection terminal 12. In addition, the to-be-plated layer 31 has the same shape pattern as the plurality of touch detection electrodes 11 and is composed of a plurality of thin wires. The plurality of touch detection electrodes 11 are formed on the to-be-plated layer 31 by a wet plating method.

The touch detection electrode 11 is formed by a wet plating method, and is thus formed to cover a side portion 31A of the to-be-plated layer 31. Therefore, a portion of the touch detection electrode 11 that is formed on the side portion 31A of the to-be-plated layer 31 is in contact with the detection electrode connection terminal 12 so that the touch detection electrode 11 and the detection electrode connection terminal 12 are reliably electrically connected to each other and are not affected by a level difference at the boundary between the detection region R1 and the peripheral region R2 in the first conductive layer 2, that is caused due to the separate formation of the touch detection electrode 11 and the detection electrode connection terminal 12.

Although not shown in FIG. 5, the peripheral wiring 13 and the external connection terminal 14 are formed on the first surface 1A of the substrate 1 in the peripheral region R2, similar to the detection electrode connection terminal 12. In addition, in FIG. 5, the second conductive layer 3 is omitted for the sake of simplification of the description, but similarly to the first conductive layer 2, the second conductive layer 3 also has a layer structure in which the touch detection electrode 21 is formed on a to-be-plated layer 31, and the detection electrode connection terminal 22, the to-be-plated layer 31, and the touch detection electrode 21 are laminated in this order from the second surface 1B of the substrate 1 at an edge portion of the peripheral region R2 facing the detection region R1.

Here, the touch sensor can also have a first protective layer (not shown) that covers at least the plurality of peripheral wirings 13 and 23. In a case where the first protective layer forms a to-be-plated layer 31 containing a catalyst as a composition, or in a case where a to-be-plated layer 31 is formed and a catalyst is then imparted to a surface of the to-be-plated layer 31, the catalyst adheres between the plurality of peripheral wirings 13 and between the plurality of peripheral wirings 23, whereby it is possible to prevent a short circuit from occurring due to the precipitation of a metal between the plurality of peripheral wirings 13 and between the plurality of peripheral wirings 23.

In addition, the touch sensor can also have a second protective layer (not shown) covering the plurality of touch detection electrodes 11 and 21 in order to mechanically protect the plurality of touch detection electrodes 11 and 21.

The first protective layer is preferably composed of, for example, a material that prevents a liquid from entering in order to prevent the catalyst from adhering to the plurality of peripheral wirings 13 and 23. In addition, for example, the second protective layer is preferably composed of a transparent material mechanically protecting the plurality of touch detection electrodes 11 and 21 for a case where the touch panel is used in a state of being disposed on a display module (not shown). As described above, the compositions of the first protective layer and the second protective layer can be made different from each other according to the purpose of the first protective layer and the second protective layer.

Figure 6:
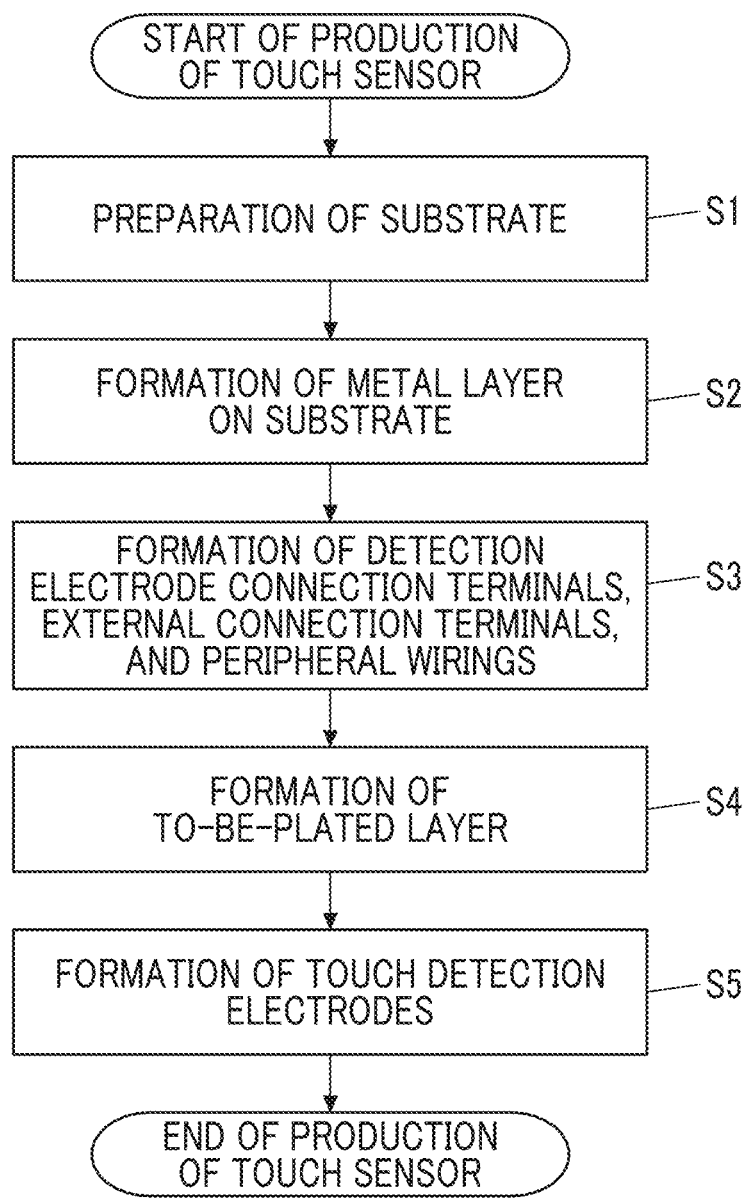
FIG. 6 is a flowchart showing a method of producing the touch sensor according to the embodiment.

Next, a method of producing of the touch sensor according to the embodiment of the present invention will be described referring to a flowchart of FIG. 6.

First, a substrate 1 is prepared in Step S1. In the substrate 1, a detection region R1 and a peripheral region R2 are defined.

In Step S2, a metal layer is formed on a first surface 1A and a second surface 1B in the peripheral region R2 of the substrate 1 prepared in Step S1. In this case, for example, the metal layer can be formed by a so-called dry plating method such as a so-called vacuum deposition method or a so-called sputtering method.

In Step S3, the metal layers formed in Step S2 are processed to form a plurality of detection electrode connection terminals 12, a plurality of peripheral wirings 13, and a plurality of external connection terminals 14 on the first surface 1A of the substrate 1 in the peripheral region R2, and to form a plurality of detection electrode connection terminals 22, a plurality of peripheral wirings 23, and a plurality of external connection terminals 24 on the second surface 1B of the substrate 1 in the peripheral region R2.

In this case, first, a photosensitive resist liquid is applied onto the metal layer formed on the first surface 1A of the substrate 1, and the applied photosensitive resist is dried by being heated for a predetermined time. A photo mask having an exposure pattern corresponding to the plurality of detection electrode connection terminals 12, the plurality of peripheral wirings 13, and the plurality of external connection terminals 14 is disposed to be close to or in contact with the dried photosensitive resist, and in this state, the photosensitive resist is irradiated with ultraviolet rays through the photo mask. Thereafter, the substrate 1 is immersed in a developer corresponding to the photosensitive resist, so that the photosensitive resist is patterned into a shape corresponding to the plurality of detection electrode connection terminals 12, the plurality of peripheral wirings 13, and the plurality of external connection terminals 14.

Figure 7:
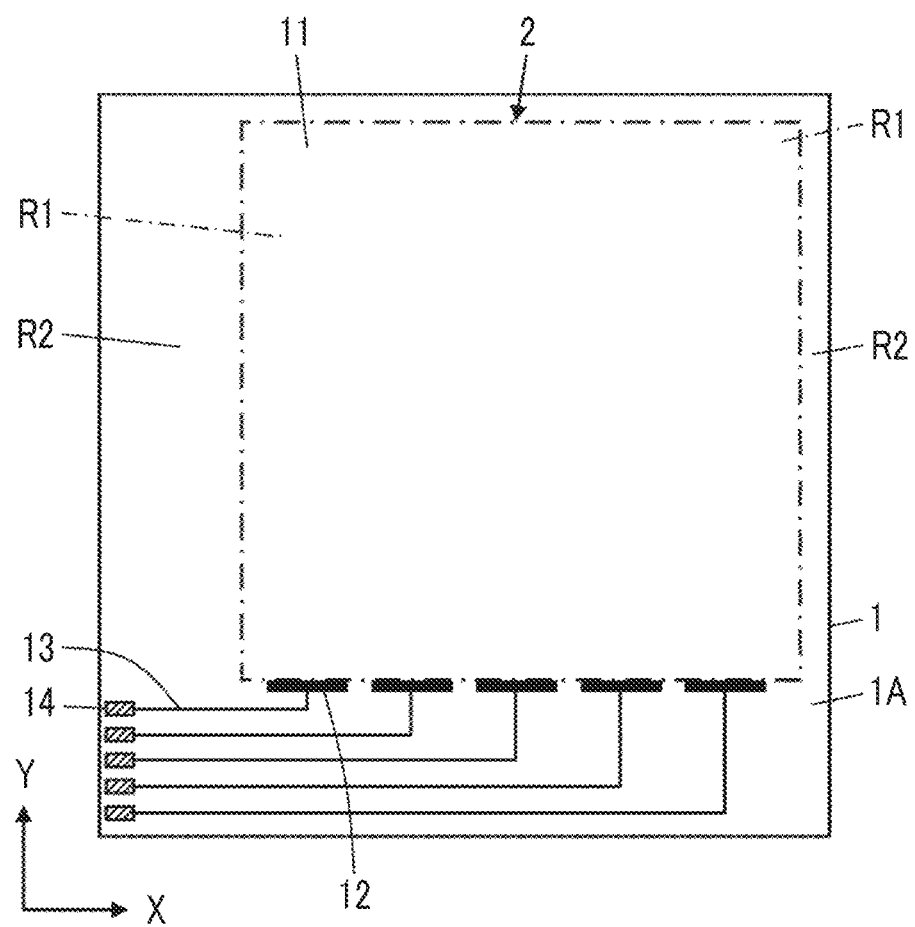
FIG. 7 is a plan view of a substrate in which a detection electrode connection terminal, a peripheral wiring, and an external connection terminal are formed.
Figure 8:
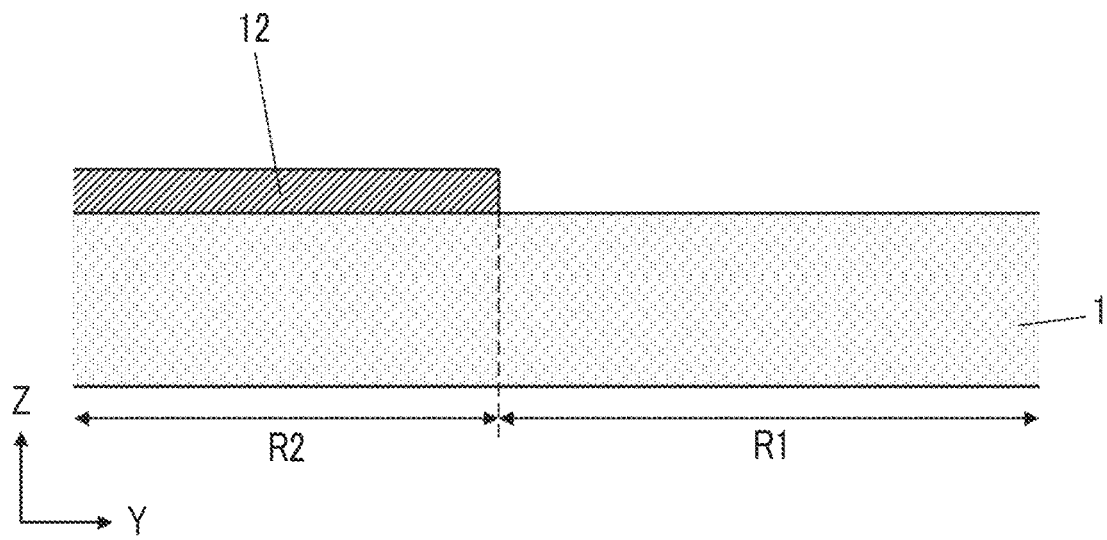
FIG. 8 is an enlarged cross-sectional view showing a part of the substrate in which the detection electrode connection terminal, the peripheral wiring, and the external connection terminal are formed.

In a state in which the photosensitive resist patterned as above is disposed on the metal layer, the substrate 1 is immersed in an etchant to subject the metal layer to wet etching, and the photosensitive resist is removed using a resist stripper. Therefore, the plurality of detection electrode connection terminals 12, the plurality of peripheral wirings 13, and the plurality of external connection terminals 14 are formed as shown in FIG. 7. In this stage, as shown in FIG. 8, in the vicinity of the boundary between the detection region R1 and the peripheral region R2, the detection electrode connection terminal 12 is disposed on the first surface 1A of the substrate 1 in the peripheral region R2, but nothing is formed in the detection region R1.

As the photosensitive resist used in Step S3, a so-called negative photosensitive resist can be used, and a so-called positive photosensitive resist can also be used. In addition, as the etchant used for wet etching, any solution can be used as long as it is a solution that dissolves the metal layer.

In addition, a plurality of detection electrode connection terminals 22, a plurality of peripheral wirings 23, and a plurality of external connection terminals 24 can be formed on the second surface 1B of the substrate 1 in the same manner as the plurality of detection electrode connection terminals 12, the plurality of peripheral wirings 13, and the plurality of external connection terminals 14.

in Step S4, on the first surface 1A of the substrate 1 in the detection region R1, a to-be-plated layer 31 having a shape pattern corresponding to a plurality of touch detection electrodes 11 and extending to cover at least a part of each of the plurality of detection electrode connection terminals 12 is formed, and on the second surface 1B of the substrate 1 in the detection region R1, a to-be-plated layer 31 having a shape pattern corresponding to the plurality of touch detection electrodes 21 and extending to cover at least a part of each of the plurality of detection electrode connection terminals 22 is formed.

In this case, a liquid composition composed of a photosensitive resin material is applied onto the first surface 1A of the substrate 1 and the plurality of detection electrode connection terminals 12 in the detection region R1, and the applied liquid composition is dried by being heated for a predetermined time to form a precursor layer of a to-be-plated layer. A photo mask having an exposure pattern corresponding to the plurality of touch detection electrodes 11 is disposed to be in contact with the precursor layer of a to-be-plated layer, and in this state, the precursor layer of a to-be-plated layer is irradiated with ultraviolet rays through the photo mask. Thereafter, the substrate 1 is cleaned, and thus a to-be-plated layer 31 having a shape pattern corresponding to the plurality of touch detection electrodes 11 is formed.

In addition, the to-be-plated layer 31 contains a catalyst such as a Pd catalyst for promoting the precipitation of a metal by a wet plating method. Examples of the method of imparting a catalyst to the to-be-plated layer 31 include a method of mixing a catalyst in a precursor layer of a to-be-plated layer, a method of laminating a catalyst-containing layer on a surface of a precursor layer of a to-be-plated layer, and a method including patterning a precursor layer of a to-be-plated layer and performing a treatment with a catalyst-containing treatment liquid.

Figure 9:
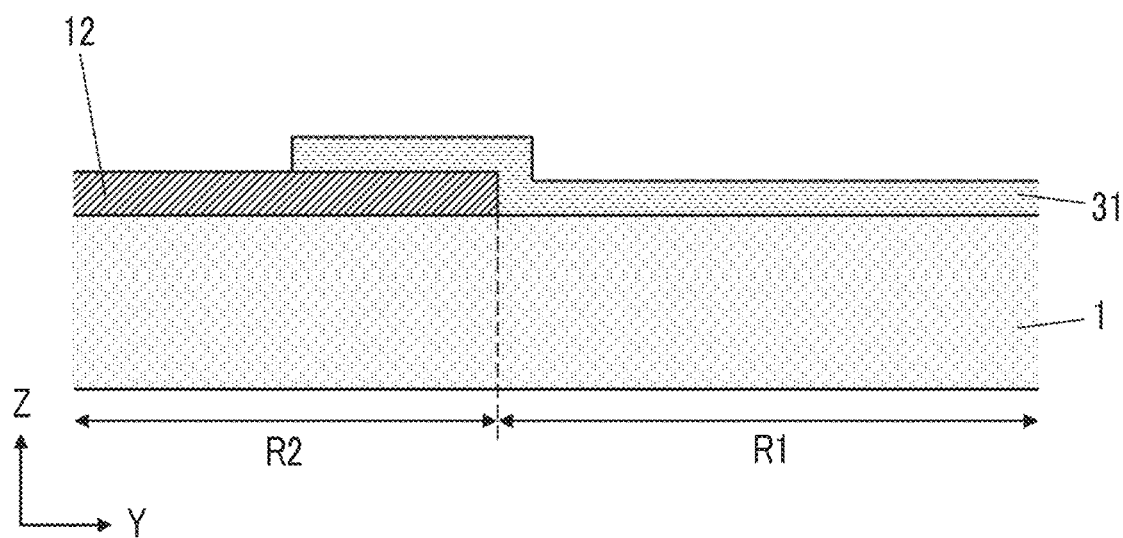
FIG. 9 is an enlarged cross-sectional view showing a part of the substrate in which a to-be-plated layer is formed.

The to-be-plated layer 31 containing a catalyst and formed as described above is formed on the first surface 1A of the substrate 1 in the detection region R1 and extends to the peripheral region R2 to cover at least a part of the detection electrode connection terminal 12 as shown in FIG. 9.

The to-be-plated layer 31 on the second surface 1B side of the substrate 1 can be formed on the second surface 1B of the substrate 1 by the same method as that for the to-be-plated layer 31 on the first surface 1A side of the substrate 1.

In Step S5, the plurality of touch detection electrodes 11 electrically connected to the plurality of detection electrode connection terminals 12 and the plurality of touch detection electrodes 21 electrically connected to the plurality of detection electrode connection terminals 22 are formed by a wet plating method on the to-be-plated layers 31 on the first surface 1A side and the second surface 1B side of the substrate 1 formed in Step S4.

The touch detection electrode 11 formed as described above is formed to cover the side portion 31A of the to-be-plated layer 31 as shown in FIG. 5. Therefore, the portion of the touch detection electrode 11 that is formed on the side portion 31A of the to-be-plated layer 31 is in contact with the detection electrode connection terminal 12, and the touch detection electrode 11 and the detection electrode connection terminal 12 are reliably electrically connected to each other. Although not shown in the drawing, the touch detection electrode 21 formed on the second surface 1B side of the substrate 1 is also electrically connected to the detection electrode connection terminal 22 in the same manner as the touch detection electrode 11 formed on the first surface 1A side.

In a case where Step S5 is completed, the production of the touch sensor according to the embodiment of the present invention is completed.

Here, in the general production of touch sensors, for example, a plurality of touch detection electrodes 11, a plurality of detection electrode connection terminals 12, a plurality of peripheral wirings 13, and a plurality of external connection terminals 14 are formed together in many cases in order to facilitate the production. In this case, for example, in a case where a wet plating method is used, bubbles generated during the plating treatment or impurities mixed for some reason may be placed at some positions on the plurality of peripheral wirings 13, and thus some of the plurality of peripheral wirings 13 may be formed in a disconnected state, or the plating for the touch detection electrodes 11 may be performed non-uniformly. In addition, for example, in a case where a method of subjecting the metal layer to wet etching is used, it is difficult to make the touch detection electrodes 11 fine, and for example, some of a plurality of fine metal wires M constituting the plurality of touch detection electrodes 11 may be mechanically disconnected in the removal of the photosensitive resist patterned and disposed on the metal layer by ultrasonic cleaning.

In the method of producing a touch sensor according to the embodiment of the present invention, since the plurality of detection electrode connection terminals 12, the plurality of peripheral wirings 13, and the plurality of external connection terminals 14 are formed by a method of etching a metal layer, and then the plurality of touch detection electrodes 11 are formed by a wet plating method, it is possible to prevent the disconnection of the plurality of peripheral wirings 13 and the plurality of fine metal wires M constituting the plurality of touch detection electrodes 11 in the production process.

Although it has been described that the metal layer can be formed by a dry plating method in Step S2, the metal layer can also be formed by a wet plating method. In this case, for example, a to-be-plated layer can be formed on the first surface 1A and the second surface 1B of the substrate 1 in the peripheral region R2, and the substrate 1 can be immersed in a plating liquid to form a metal layer on the to-be-plated layers. The metal layers formed as described above are subjected to wet etching in Step S3, and as a result, the plurality of detection electrode connection terminals 12, the plurality of peripheral wirings 13, and the plurality of external connection terminals 14 are formed on the first surface 1A side of the substrate 1 and the plurality of detection electrode connection terminals 22, the plurality of peripheral wirings 23, and the plurality of external connection terminals 24 are formed on the second surface 1B side.

In addition, the touch sensor production process may include a step of forming a first protective layer (not shown) that covers at least the plurality of peripheral wirings 13 and 23 between Step S3 where the plurality of detection electrode connection terminals 12 and 22, the plurality of peripheral wirings 13 and 23, and the plurality of external connection terminals 14 and 24 are formed and Step S4 where the to-be-plated layers 31 are formed.

In addition, the touch sensor production process may include a step of forming a second protective layer (not shown) covering the plurality of touch detection electrodes 11 and 21 after Step S5 where the plurality of touch detection electrodes 11 and 21 are formed.

Hereinafter, each of the members constituting the touch sensor according to embodiment will be described.

Substrate

The type of the substrate 1 is not particularly limited as long as it is a member that can support the first conductive layer 2 and the second conductive layer 3. Examples of the substrate 1 include a plastic substrate, a glass substrate, and a metal substrate, among which the plastic substrate is preferable.

As the substrate 1, a flexible substrate is preferable from the viewpoint of excellent bendability. Examples of the flexible substrate include the plastic substrate.

The thickness of the substrate 1 is not particularly limited and is 25 μm to 500 μm in many cases.

As a material constituting the substrate 1, a resin having a melting point of about 290° C. or lower such as polyethylene terephthalate (PET), polycycloolefin, polycarbonate, an acrylic film, polyethylene naphthalate, polyethylene, polypropylene, polystyrene, polyvinyl chloride, polyvinylidene chloride, or triacetyl cellulose is preferable, and PET, polycycloolefin, or polycarbonate is more preferable. Among these, PET is particularly preferable from the viewpoint of excellent adhesiveness between the first conductive layer 2 and the second conductive layer 3.

The total light transmittance of the substrate 1 is preferably 85% to 100%. The total light transmittance is measured using "Plastics—Determination of Total Luminous Transmittance and Reflectance" defined by Japanese Industrial Standards (JIS) K 7375:2008.

Examples of a suitable aspect of the substrate 1 include a treated substrate that has undergone at least one treatment selected from the group consisting of an atmospheric pressure plasma treatment, a corona discharge treatment, and an ultraviolet irradiation treatment. By performing the above-described treatment, a hydrophilic group such as an OH group is introduced into the treated surface of the substrate 1, whereby the adhesiveness between the substrate 1 and the first conductive layer 2 and the adhesiveness between the substrate 1 and the second conductive layer 3 are improved. In addition, the atmospheric pressure plasma treatment is preferable among the above-described treatments from the viewpoint of further improving the adhesiveness between the substrate 1 and the first conductive layer 2 and the adhesiveness between the substrate 1 and the second conductive layer 3.

Undercoat Layer

In order to improve the adhesiveness between the substrate 1 and the first conductive layer 2 and the adhesiveness between the substrate 1 and the second conductive layer 3, an undercoat layer can also be disposed between the substrate 1 and the first conductive layer 2 and between the substrate 1 and the second conductive layer 3. The undercoat layer includes a polymer so that the adhesiveness between the substrate 1 and the first conductive layer 2 and the adhesiveness between the substrate 1 and the second conductive layer 3 are further improved.

The method of forming the undercoat layer is not particularly limited, and examples thereof include a method including applying a composition for forming an undercoat layer including a polymer to the substrate 1 and optionally performing a stretching treatment. In addition, gelatin, an acrylic resin, a urethane resin, an acrylic styrene latex including fine particles of an inorganic material or a polymer, or the like may be used as the composition for forming an undercoat layer including a polymer.

In the touch sensor, as a layer other than the above-described undercoat layer, a refractive index adjusting layer may be optionally provided between the substrate 1 and the first conductive layer 2 and between the substrate 1 and the second conductive layer 3. For example, an organic layer to which particles of a metal oxide such as a zirconium oxide that adjusts a refractive index has been added can be used as the refractive index adjusting layer.

Touch Detection Electrodes, Detection Electrode Connection Terminals, Peripheral Wirings, and External Connection Terminals As a material for forming the touch detection electrodes 11 and 21, the detection electrode connection terminals 12 and 22, the peripheral wirings 13 and 23, and the external connection terminals 14 and 24, a metal or an alloy can be used. For example, they can be formed of silver, copper, gold, aluminum, nickel, chromium, molybdenum, or tungsten. The touch detection electrodes 11 and 21, the detection electrode connection terminals 12 and 22, the peripheral wirings 13 and 23, and the external connection terminals 14 and 24 preferably contains copper, but may contain a metal other than copper, such as gold and silver. In addition, the detection electrode connection terminals 12 and 22, the peripheral wirings 13 and 23, and the external connection terminals 14 and 24 may have a laminated structure of a metal and a metal compound. In this case, fine metal wires with a laminated structure of copper/copper oxide or copper/copper sulfide can be used.

To-be-Plated Layer

The to-be-plated layer 31 contains an organic substance as a main component.

Inclusion of the organic substance as a main component means that the content of the organic substance with respect to a total mass of the to-be-plated layer 31 is more than 50% by mass, and the content is preferably 80% by mass or more, and more preferably 90% by mass or more. The upper limit thereof is not particularly limited and may be 100% by mass.

The to-be-plated layer 31 is preferably a layer having a functional group (hereinafter, also referred to as "interactive group") that interacts with a plating catalyst or its precursor. The interactive group is intended to mean a functional group capable of interacting with a plating catalyst or its precursor, which are imparted to the to-be-plated layer 31, and examples thereof include a functional group that can form an electrostatic interaction with the plating catalyst or its precursor, and a nitrogen-containing functional group, a sulfur-containing functional group, and an oxygen-containing functional group, that can form a coordination with the plating catalyst or its precursor. As the interactive group, from the viewpoint of high polarity and high adsorption ability to the plating catalyst or its precursor, an ionic polar group such as a carboxylic acid group, a sulfonic acid group, a phosphoric acid group, and a boronic acid group, or a cyano group is preferable, and a carboxylic acid group or a cyano group is more preferable. The to-be-plated layer 31 usually includes a compound having the above-described interactive group. The compound is preferably a polymer. That is, the to-be-plated layer 31 preferably includes a polymer including a repeating unit having an interactive group.

In addition, the to-be-plated layer 31 preferably includes a plating catalyst or its precursor. The plating catalyst or its precursor is preferably an electroless plating catalyst or its precursor. The electroless plating catalyst is not particularly limited as long as it serves as an active nucleus during electroless plating, and examples thereof include a metal having catalytic activity for an autocatalytic reduction reaction (known as a metal capable of electroless plating with a lower ionization tendency than Ni). Specific examples thereof include Pd, Ag, Cu, Pt, Au, and Co.

The method of producing the to-be-plated layer 31 is not particularly limited, and examples thereof include a method in which a precursor layer of a to-be-plated layer is formed from a composition for forming a to-be-plated layer applied onto the substrate 1, and subjected to an exposure treatment and a development treatment to form a to-be-plated layer 31 having a shape pattern corresponding to the touch detection electrodes 11, and a plating catalyst or its precursor is imparted to the obtained to-be-plated layer 31.

The composition for forming a to-be-plated layer contains the following compound X or composition Y.

Compound X: A compound having an interactive group and a polymerizable group

Composition Y: A composition containing a compound having an interactive group, and a compound having a polymerizable group The compound X is a compound having an interactive group and a polymerizable group. The definition of the interactive group is as described above. In addition, the compound X may have two or more interactive groups.

The polymerizable group is a functional group capable of forming a chemical bond by energy application, and examples thereof include a radically polymerizable group and a cationically polymerizable group. Among these, a radically polymerizable group is preferable from the viewpoint of a more excellent reactivity. As the radically polymerizable group, a methacryloyloxy group, an acryloyloxy group, or a styryl group is more preferable. The compound X may have two or more polymerizable groups. In addition, the number of the polymerizable groups contained in the compound X is not particularly limited and may be one or two or more.

The compound X may be a low-molecular-weight compound or a high-molecular-weight compound. The low-molecular-weight compound is intended to mean a compound having a molecular weight of less than 1,000, and the high-molecular-weight compound is intended to mean a compound having a molecular weight of 1,000 or more. In a case where the compound X is a polymer, the weight-average molecular weight of the polymer is not particularly limited and is preferably 1,000 to 700,000, and more preferably 2,000 to 200,000 from the viewpoint of more excellent handleability such as solubility. The method of synthesizing the polymer having a polymerizable group and an interactive group is not particularly limited, and a known synthesis method (refer to paragraphs to of JP2009-280905A) is used.

The composition Y is a composition containing a compound having an interactive group and a compound having a polymerizable group. That is, the composition Y contains two types of compounds: a compound having an interactive group; and a compound having a polymerizable group. The definitions of the interactive group and the polymerizable group are as described above. The compound having an interactive group may be a low-molecular-weight compound or a high-molecular-weight compound. The compound having an interactive group may contain a polymerizable group. Preferred aspects of the compound having an interactive group include a polymer including a repeating unit having an interactive group (for example, a polyacrylic acid).

Preferred aspects of the polymer including a repeating unit having an interactive group include a polymer Z having a repeating unit derived from a conjugated diene compound and a repeating unit derived from an unsaturated carboxylic acid or a derivative thereof since the to-be-plated layer 31 is easily formed with a small amount of energy applied (for example, an exposure amount). The conjugated diene compound is not particularly limited as long as it is a compound having a molecular structure that has two carbon-carbon double bonds separated by one single bond.

The repeating unit derived from a conjugated diene compound is preferably a repeating unit derived from a compound having a butadiene skeleton. Examples of the compound having a butadiene skeleton (a monomer having a butadiene structure) include 1,3-butadiene, isoprene, 2-ethyl-1,3-butadiene, 2-n-propyl-1,3-butadiene, 2,3-dimethyl-1,3-butadiene, 1-phenyl-1,3-butadiene, 1-α-naphthyl-1,3-butadiene, 1-β-naphthyl-1,3-butadiene, 2-chloro-1,3-butadiene, 1-bromo-1,3-butadiene, 1-chlorobutadiene, 2-fluoro-1,3-butadiene, 2,3-dichloro-1,3-butadiene, 1,1,2-trichloro-1,3-butadiene, and 2-cyano-1,3-butadiene.

The content of the repeating unit derived from a conjugated diene compound in the polymer Z is preferably 25% to 75% by mole with respect to all the repeating units. The content of the repeating unit derived from an unsaturated carboxylic acid or a derivative thereof in the polymer Z is preferably 25% to 75% by mole with respect to all the repeating units.

The compound having a polymerizable group is a so-called monomer, and a polyfunctional monomer having two or more polymerizable groups is preferable from the viewpoint that the hardness of a to-be-plated layer 31 to be formed is more excellent. Specifically, the polyfunctional monomer is preferably a monomer having 2 to 6 polymerizable groups. The molecular weight of the polyfunctional monomer to be used is preferably 150 to 1,000, and more preferably 200 to 800 from the viewpoint of the mobility of molecules during the crosslinking reaction that affects the reactivity.

The composition for forming a to-be-plated layer may contain components other than the above-described components. For example, the composition for forming a to-be-plated layer may contain a polymerization initiator. The type of the polymerization initiator is not particularly limited, and examples thereof include a known polymerization initiator (preferably a photopolymerization initiator). The composition for forming a to-be-plated layer may contain a solvent. The type of the solvent is not particularly limited and examples thereof include water and an organic solvent. Examples of the organic solvent include known organic solvents (for example, an alcohol-based solvent, an ester-based solvent, a ketone-based solvent, a halogen-based solvent, and a hydrocarbon-based solvent).

EXAMPLES

Example 1

The present invention will be described in more detail based on examples below. Materials, used amounts, ratios, treatment details, and treatment procedures shown in the following examples can be appropriately changed without departing from the gist of the present invention. Accordingly, the scope of the present invention is not limited to the following examples.

Preparation of Substrate

An optical PET film (manufactured by Toyobo Co., Ltd.: COSMOSHINE A4360) having a thickness of 75 μm was prepared as a substrate 1.

Formation of Metal Layer

As an underlayer improving the adhesiveness with a metal, a nickel layer having a thickness of 0.05 μm was formed on a first surface 1A of the prepared optical PET film by a sputtering method. Next, as a metal layer, a copper layer was deposited to have a thickness of 0.5 μm.

Formation of Plurality of Detection Electrode Connection Terminals, Plurality of Peripheral Wirings, and Plurality of External Connection Terminals A positive photosensitive resist was applied to the metal layer to achieve a thickness of about 2.00 μm by a roll coating method, and dried at 110° C. for 2 minutes. Then, a photo mask having an exposure pattern corresponding to a plurality of detection electrode connection terminals 12, a plurality of peripheral wirings 13, and a plurality of external connection terminals 14 was stacked, and proximity exposure with a high-pressure mercury lamp and development using an alkaline solution were performed. Therefore, a photosensitive resist pattern corresponding to the plurality of detection electrode connection terminals 12, the plurality of peripheral wirings 13, and the plurality of external connection terminals 14 was formed. Next, the metal layer was etched with a ferric chloride ($FeCl_3$) solution, and then cleaned with pure water. Finally, the photosensitive resist was peeled off to obtain the plurality of detection electrode connection terminals 12, the plurality of peripheral wirings 13, and the plurality of external connection terminals 14.

Formation of First Protective Layer

An ultraviolet curable ink (manufactured by Asahi Chemical Research Laboratory Co., Ltd.: UVF-10T (KAI)) was applied onto the plurality of peripheral wirings 13 by a screen printing method. Next, the applied ultraviolet curable ink was irradiated with ultraviolet rays at 800 mJ/$cm^2$ using a high-pressure mercury lamp and cured, so that a first protective layer for protecting the plurality of peripheral wirings 13 was formed with a thickness of about 6.00 μm.

Preparation of Composition for Forming to-be-Plated Layer

The following respective components were mixed to obtain a composition for forming a to-be-plated layer.

| | |
|---|---|
| Isopropanol | 38 parts by mass |
| Polybutadiene maleic acid (butadiene-maleic acid alternating copolymer, repeating units derived from butadiene:repeating units derived from maleic acid = 1:1 (molar ratio), manufactured by Polysciences, Inc.) | 4 parts by mass |
| FAM-201 (bifunctional acrylamide, manufactured by FUJIFILM Corporation) | 1 part by mass |
| IRGACURE-OXE02 (Oxime ester-based polymerization initiator, manufactured by BASF SE) | 0.05 parts by mass |

Formation of To-Be-Plated Layer

The above-described composition for forming a to-be-plated layer was applied to the first surface 1A side of the substrate 1 by bar coating to achieve a thickness of about 0.30 μm. As a result, a precursor layer of a to-be-plated layer was formed. Next, after drying at 120° C. for 1 minute, a protective film made of polypropylene with a thickness of 12.00 µm was immediately attached to a surface of the precursor layer of a to-be-plated layer.

A photo mask having an exposure pattern corresponding to a plurality of touch detection electrodes 11 was stacked on the precursor layer of a to-be-plated layer with the protective film attached thereto, and irradiated with ultraviolet rays at 30 mJ/cm$^2$ using a high-pressure mercury lamp. Next, the protective film was peeled off from the surface of the precursor layer of a to-be-plated layer, and alkaline development was performed by shower cleaning with a 1% by mass sodium carbonate aqueous solution to obtain a to-be-plated layer 31 having a shape pattern corresponding to the plurality of mesh-like touch detection electrodes 11.

Formation of Touch Detection Electrodes

A Pd catalyst-imparting liquid Omnishield 1573 activator (manufactured by Rohm and Haas Electronic Materials LLC) was diluted with pure water to 3.6% by volume, and the pH was adjusted to 4 with 0.1 N hydrochloric acid. In the resulting solution, the substrate 1 with the to-be-plated layer 31 formed thereon was immersed at a temperature of 45° C. for 5 minutes, and then cleaned twice with pure water. Next, the substrate 1 was immersed in a 0.8% by volume aqueous solution of a reducing agent CIRCUPOSIT PB Oxide converter 60C (manufactured by Rohm and Haas Electronic Materials LLC) at a temperature of 30° C. for 5 minutes. Then, the substrate 1 was cleaned twice with pure water and subjected to a Pd catalyst treatment. Next, the substrate 1 subjected to the Pd catalyst treatment was immersed in an electroless plating liquid obtained by mixing 12% by volume of an M agent, 6% by volume of an A agent, and 10% by volume of a B agent of CIRCUPOSIT 4500 (manufactured by Rohm and Haas Electronic Materials LLC) at a temperature of 40° C. for 50 minutes, and then cleaned with pure water. Therefore, a plurality of touch detection electrodes 11 covering the to-be-plated layer 31 and electrically connected to the plurality of detection electrode connection terminals 12 were formed.

In this manner, a touch sensor of Example 1 was obtained. The touch sensor of Example 1 had: 50 touch detection electrodes 11 having an electrode width of 2 mm in the X direction and an electrode length of 100 mm in the Y direction; 50 detection electrode connection terminals 12 connected to the 50 touch detection electrodes 11; 50 peripheral wirings 13 connected to the 50 detection electrode connection terminals 12; and 50 external connection terminals 14 connected to the 50 peripheral wirings 13.

In addition, a line width W1 of a plurality of fine metal wires M constituting the touch detection electrodes 11 was 1.50 µm, and a line width W2 and an inter-wiring distance L2 of the plurality of peripheral wirings 13 were all 15.00 µm.

The line width W1 of the plurality of fine metal wires M was calculated by randomly measuring the line width W1 at plural positions while observing the plurality of fine metal wires M with an optical microscope, and calculating the arithmetic mean of the measured values. The line width W2 of the plurality of peripheral wirings 13 was also calculated in the same manner as the line width W1 of the plurality of fine metal wires M. In addition, the inter-wiring distance L2 of the plurality of peripheral wirings 13 was calculated by performing, on all combinations of pairs of peripheral wirings 13 adjacent to each other, the measurement of the inter-wiring distance L2 at a position where a pair of peripheral wirings 13 were closest to each other, and calculating the arithmetic mean of the measured values.

Example 2

A touch sensor of Example 2 was produced in the same manner as in Example 1, except that each of average values of a line width W2 and an inter-wiring distance L2 of a plurality of peripheral wirings 13 was 30.00 µm.

Comparative Example 1

A touch sensor of Comparative Example 1 was produced in the same manner as in Example 1, except that a plurality of touch detection electrodes 11, a plurality of detection electrode connection terminals 12, a plurality of peripheral wirings 13, and a plurality of external connection terminals 14 were formed together by a wet plating method in the same manner as in the step of preparing a composition for forming a to-be-plated layer, the step of forming a to-be-plated layer 31, and the step of forming touch detection electrodes 11.

Comparative Example 2

A touch sensor of Example 2 was produced in the same manner as in Comparative Example 1, except that each of average values of a line width W2 and an inter-wiring distance L2 of a plurality of peripheral wirings 13 was 30.00 µm.

With regard to the touch sensors of Examples 1 and 2 and Comparative Examples 1 and 2 produced as above, disconnection of peripheral wirings was evaluated.

Evaluation of Disconnection of Peripheral Wirings

An electric resistance value of each peripheral wiring 13 between the detection electrode connection terminal 12 and the external connection terminal 14 was measured. A touch sensor in which the number of positions where the electric resistance value was 1 kΩ or more was one or more was determined as a defective product. 100 identical touch sensors were produced, and a rate of occurrence of defective products was calculated by dividing the number of defective products by 100, that is the total number of the touch sensors. The evaluation was performed based on the following standards. In the evaluation, A represents that the rate of occurrence of defective products is low and the disconnection of the plurality of peripheral wirings 13 can be sufficiently prevented, and both B and C represent that there is a practical problem in the rate of occurrence of defective products in the evaluation.

A: The rate of occurrence of defective products is 2% or less.

B: The rate of occurrence of defective products is more than 2% and 5% or less.

C: The rate of occurrence of defective products is more than 5%.

Table 1 shows the evaluation results for Examples 1 and 2 and Comparative Examples 1 and 2.

In the "Formation Timing" column in Table 1, the expression "Separate Formation" represents that the plurality of touch detection electrodes 11 are formed after formation of the plurality of detection electrode connection terminals 12, the plurality of peripheral wirings 13, and the plurality of external connection terminals 14. The expression "Simultaneous Formation" represents that they are formed simultaneously.

TABLE 1

| | Forming Method | | | Line Width W2 and Inter-Wiring Distance L2 of Peripheral Wirings | Evaluation of Disconnection of Peripheral Wirings |
|---|---|---|---|---|---|
| | Detection Electrode Connection Terminals, Peripheral Wirings, External Connection Terminals | Touch Detection Electrodes | Formation Timing | | |
| Example 1 | Wet Etching | Wet Plating Method | Separate Formation | 15.00 μm | A |
| Example 2 | Wet Etching | Wet Plating Method | Separate Formation | 30.00 μm | A |
| Comparative Example 1 | Wet Plating Method | Wet Plating Method | Simultaneous Formation | 15.00 μm | C |
| Comparative Example 2 | Wet Plating Method | Wet Plating Method | Simultaneous Formation | 30.00 μm | B |

As shown in Table 1, it is found that in any of the touch sensors of Examples 1 and 2, the disconnection of the peripheral wirings 13 is all evaluated as A, and thus the disconnection of the plurality of peripheral wirings 13 can be sufficiently prevented. It is conceivable that in Examples 1 and 2, since the metal layer is patterned through photolithography and wet etching is performed to form the plurality of peripheral wirings 13, it is possible to stably form peripheral wirings 13 that are not disconnected.

Meanwhile, in the touch sensor of Comparative Example 1, the disconnection of the peripheral wiring 13 was evaluated as C, and in the touch sensor of Comparative Example 2, the disconnection of the peripheral wiring 13 was evaluated as B. It is conceivable that in the touch sensors of Comparative Examples 1 and 2, since the plurality of peripheral wirings 13 are formed by a wet plating method, for example, bubbles generated during the plating treatment or impurities mixed for some reason are placed on the to-be-plated layer 31 corresponding to the peripheral wirings 13, and thus many peripheral wirings 13 are formed in a disconnected state. In particular, it is conceivable that in the touch sensor of Comparative Example 1, since the line width W2 of the peripheral wirings 13 is as thin as 15.00μ, the disconnection of the peripheral wirings 13 occurs more easily than in Comparative Example 2 in which the line width W2 of the peripheral wiring 13 is 30.00 μm.

The present invention is basically configured as described above. Hereinabove, the touch sensor according to the embodiment of the present invention has been described in detail. However, the present invention is not limited to the above-described embodiments, and various improvements or modifications can be made within a range not departing from the scope of the present invention.

EXPLANATION OF REFERENCES

1: substrate
1A: first surface
1B: second surface
2: first conductive layer
3: second conductive layer
11, 21: touch detection electrode
12, 22: detection electrode connection terminal
13, 23: peripheral wiring
14, 24: external connection terminal
31: to-be-plated layer
31A: side portion
L2: inter-wiring distance
M: fine metal wire
R1: detection region
R2: peripheral region
W1, W2: line width

What is claimed is:

1. A method of producing a touch sensor, the method comprising in order:
   preparing a substrate including a detection region and a peripheral region disposed around the detection region;
   forming a metal layer in the peripheral region of the substrate;
   forming a plurality of detection electrode connection terminals, a plurality of external connection terminals, and a plurality of peripheral wirings that connect the plurality of detection electrode connection terminals and the plurality of external connection terminals to each other by patterning a photosensitive resist on a surface of the metal layer through photolithography and subjecting the metal layer to wet etching;
   forming a to-be-plated layer that is formed in the detection region of the substrate, extends to cover at least a part of each of the plurality of detection electrode connection terminals, and includes a pattern composed of a plurality of thin wires; and
   forming a plurality of touch detection electrodes that are electrically connected to the plurality of detection electrode connection terminals on the to-be-plated layer by a wet plating method.

2. The method of producing a touch sensor according to claim 1, the method further comprising:
   forming a first protective layer that covers at least the plurality of peripheral wirings between forming the plurality of detection electrode connection terminals, the plurality of external connection terminals, and the plurality of peripheral wirings and forming the to-be-plated layer.

3. The method of producing a touch sensor according to claim 2, the method further comprising:
   forming a second protective layer that covers the plurality of touch detection electrodes.

4. The method of producing a touch sensor according to claim 3,
   wherein the first protective layer and the second protective layer have different compositions.

5. The method of producing a touch sensor according to claim 1,
   wherein the to-be-plated layer is formed through photolithography.

6. The method of producing a touch sensor according to claim 2, wherein the to-be-plated layer is formed through photolithography.

7. The method of producing a touch sensor according to claim 3,
wherein the to-be-plated layer is formed through photolithography.

8. The method of producing a touch sensor according to claim 4,
wherein the to-be-plated layer is formed through photolithography.

9. A touch sensor comprising:
a substrate including a detection region and a peripheral region disposed around the detection region;
a plurality of detection electrode connection terminals disposed in the peripheral region of the substrate;
a plurality of external connection terminals disposed in the peripheral region of the substrate;
a plurality of peripheral wirings disposed in the peripheral region of the substrate and connecting the plurality of detection electrode connection terminals and the plurality of external connection terminals to each other;
a to-be-plated layer that is formed in the detection region of the substrate, extends to cover at least a part of each of the plurality of detection electrode connection terminals, and includes a pattern composed of a plurality of thin wires; and
a plurality of touch detection electrodes disposed on at least a part of each of the plurality of detection electrode connection terminals and the to-be-plated layer and electrically connected to the plurality of detection electrode connection terminals.

10. The touch sensor according to claim 9,
wherein an inter-wiring distance between the plurality of peripheral wirings adjacent to each other is 15 μm or less.

11. The touch sensor according to claim 9,
wherein the to-be-plated layer contains an organic substance as a main component and contains a palladium catalyst.

12. The touch sensor according to claim 10,
wherein the to-be-plated layer contains an organic substance as a main component and contains a palladium catalyst.

* * * * *